(12) United States Patent
Mann

(10) Patent No.: US 8,827,467 B2
(45) Date of Patent: Sep. 9, 2014

(54) MAGNIFYING IMAGING OPTICAL UNIT AND METROLOGY SYSTEM INCLUDING SAME

(75) Inventor: Hans-Juergen Mann, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 227 days.

(21) Appl. No.: 13/358,026

(22) Filed: Jan. 25, 2012

(65) Prior Publication Data

US 2012/0140351 A1 Jun. 7, 2012

Related U.S. Application Data

(63) Continuation of application No. PCT/EP2010/004518, filed on Jul. 23, 2010.

(30) Foreign Application Priority Data

Jul. 29, 2009 (DE) .................... 10 2009 035 582

(51) Int. Cl.
| | |
|---|---|
| *G02B 5/08* | (2006.01) |
| *G03F 1/24* | (2012.01) |
| *G02B 17/06* | (2006.01) |
| *G03F 1/84* | (2012.01) |
| *G21K 7/00* | (2006.01) |
| *B82Y 40/00* | (2011.01) |
| *B82Y 10/00* | (2011.01) |

(52) U.S. Cl.
CPC ............ *G02B 17/0657* (2013.01); *G03F 1/24* (2013.01); *G03F 1/84* (2013.01); *G21K 7/00* (2013.01); *B82Y 40/00* (2013.01); *B82Y 10/00* (2013.01)
USPC .......................................... 359/850

(58) Field of Classification Search
CPC .......... G02B 17/00; G01B 17/89; G01C 3/08; G01N 21/1702; G01N 21/171; G01N 21/534
USPC ................. 359/399, 420, 423, 434, 850–861; 356/4.01, 432, 435
See application file for complete search history.

(56) References Cited

U.S. PATENT DOCUMENTS

| | | | |
|---|---|---|---|
| 6,556,648 | B1 | 4/2003 | Bal |
| 7,151,592 | B2 * | 12/2006 | Hudyma et al. ................ 355/67 |
| 8,277,060 | B2 * | 10/2012 | Cook .............................. 359/850 |
| 8,534,851 | B2 * | 9/2013 | Spencer ......................... 359/859 |
| 2008/0137183 | A1 * | 6/2008 | Mann et al. .................... 359/366 |

FOREIGN PATENT DOCUMENTS

| | | |
|---|---|---|
| DE | 102 20 815 A1 | 11/2003 |
| DE | 10 2006 059 436 A1 | 6/2008 |
| WO | WO 2006/069725 | 7/2006 |

OTHER PUBLICATIONS

International Search Report for corresponding PCT/EP2010/004518, dated Sep. 22, 2010.

* cited by examiner

*Primary Examiner* — Jennifer L. Doak
(74) *Attorney, Agent, or Firm* — Fish & Richardson P.C.

(57) ABSTRACT

An imaging optical unit includes at least four mirrors to image an object field in an object plane into an image field in an image plane. The ratio of the structural length of the imaging optical unit to the imaging scale of the imaging optical unit is less than 4.9 mm. The imaging optical unit provides improved handling properties, such as, for example, when used in a metrology system.

26 Claims, 4 Drawing Sheets

MAGNIFYING IMAGING OPTICAL UNIT AND METROLOGY SYSTEM INCLUDING SAME

CROSS-REFERENCE TO RELATED APPLICATIONS

This application is a continuation of, and claims benefit under 35 USC 120 to, international application PCT/EP2010/004518, filed Jul. 23, 2010, which claims benefit under 35 USC 119 of German Application No. 10 2009 035 582.0, filed Jul. 29, 2009. International application PCT/EP2010/004518 is hereby incorporated by reference in its entirety.

FIELD

The disclosure relates to a magnifying imaging optical and a metrology system including such an imaging optical unit.

BACKGROUND

A magnifying imaging optical unit is known for the simulation and analysis of effects of properties of masks for microlithography from DE 102 20 815 A1.

SUMMARY

The disclosure provides an imaging optical unit having improved handling properties.

In some embodiments, a magnifying imaging optical unit includes at least four mirrors to image an object field in an object plane into an image field in an image plane. A ratio of the structural length of the imaging optical unit to the imaging scale of the imaging optical unit is less than 4.9 mm. The imaging optical unit can have at least one intermediate image plane between the object field and the image field.

The structural length is the distance between the two components of the imaging optical unit that are arranged furthest away from one another, wherein the object field and/or the image field are also understood as components in this context. In general, therefore, the structural length is the distance between the object field and the image field. However, if, for example, one of the mirrors is further away from one of the fields than the two fields are spaced apart from one another, the distance between one of the fields and the component that is furthest away from that field can also be involved. In this case, the structural length always relates to an unfolded beam path, that is to say to an imaging optical unit without ray deflection via plane mirrors. The ratio between the structural length and the imaging scale leads, for a given imaging scale, to a particularly compact imaging optical unit. The ratio of the structural length and the imaging scale can be less than 4.5 mm (e.g., less than 4 mm, less than 3.5 mm, less than 3 mm, 2.52 mm, less than 2.5 mm, less than 2 mm, less than 1.5 mm, 1.20 mm, less than 1.0 mm, 0.61 mm, 0.575 mm). The imaging optical unit can, of course, also be used inversely as a reducing imaging optical unit, in which case object field and image field then swap their function and the ratio between object size and image size is used as the imaging scale. The intermediate image plane between the object field and the image field leads to a compact beam path in the vicinity of the intermediate image plane and thus facilitates a compact configuration of the imaging optical unit.

An imaging scale that is greater than 500 leads to a good suitability of the imaging optical unit in the context of a metrology and inspection system. The imaging scale can be greater than 530 (e.g., greater than 600, greater than 750, greater than 1000, greater than 1500, greater than 2000).

An object-side numerical aperture of at least 0.0625 is well adapted to the imaging relationships of projection lenses of projection exposure apparatuses for EUV microlithography for producing micro- or nanostructured components. The object-side numerical aperture can be at least 0.0825 and can be at least 0.125. The imaging optical unit can be designed such that it is possible to change between these numerical apertures with the aid of an aperture stop.

An object-side chief ray angle of at least 6° is likewise adapted to the conditions during EUV projection exposure. The object-side chief ray angle can also be 8°. The imaging optical unit can be designed for a plurality of chief ray angles between which it is possible to change with the aid of an aperture stop. The same aperture stop with which, if appropriate, the object-side numerical aperture can be set can be involved in this case.

An image-side chief ray of at most 0.5° leads, on the image side, to practically perpendicular incidence of the chief rays, which can improve the resolution in the image field. The image-side chief ray angle can also be a maximum of 0.2°. Practically exactly perpendicular incidence of the chief rays in the image plane (angle of incidence equal to 0°) is also possible.

A maximum angle of incidence of a chief ray of a central field point on one of the mirrors of 7.37° allows a configuration of the imaging optical unit with a highly reflective multilayer coating for optimizing the used light throughput of the imaging optical unit. The maximum angle of incidence can be 6.65°, 6.25° or can even be 4.62°.

A maximum imaging ray angle of incidence of an imaging ray on one of the mirrors in meridional section of 13.7° has corresponding advantages. The maximum imaging ray angle of incidence can be 12.2°, 11.6° and can even be 8.7°.

An exactly four-mirror system makes possible, on account of the small number of reflections, a good throughput even when reflection losses at the mirrors are unavoidable.

A convex configuration of the fourth mirror in the beam path downstream of the object field affords the possibility, in particular, of making this mirror structurally small. This improves the possibilities of a compact configuration of the imaging optical unit.

A spherical configuration of the fourth mirror in the beam path downstream of the object can be manufactured with comparatively little outlay.

A concave configuration of the third mirror in the beam path downstream of the object plane makes it is possible to fashion an imaging optical unit having good imaging aberration correction.

An aspherical configuration for the first to third mirrors in the beam path downstream of the object field allows, in particular, for an imaging optical unit having good imaging aberration correction.

Two intermediate image planes between the object field and the image field lead to a compact beam path in the vicinity of the intermediate image planes and thus facilitate a compact configuration of the imaging optical unit.

This holds true, in particular, for an arrangement of the intermediate image plane in which the intermediate image plane is formed between first and second mirrors in the beam path downstream of the object field.

An imaging optical unit including six mirrors makes possible an imaging optical unit having good imaging aberration correction. Using spherical mirrors for the fourth to sixth mirrors in the beam path downstream of the object plane allows for comparatively cost-effective production.

Two intermediate image planes between the object field and the image field facilitate the possibilities of a compact configuration of the imaging optical unit.

A smallest radius of curvature of greater than 50 mm can be manufactured with comparatively little outlay. This holds true, in particular, if the mirror having the smallest radius of curvature is spherical.

A configuration of the imaging optical unit that is telecentric on the image side reduces the accuracy requirements, as far as the arrangement of a component in the region of the image field is concerned.

An arcuate imaging field can be achieved when the object field and/or the image field are/is arranged overall at a distance from a common axis of rotational symmetry of reflection surfaces of the imaging optical unit.

The advantages of a metrology or inspection system including an imaging optical unit as disclosed herein correspond to those which have already been explained above with reference to the imaging optical unit.

BRIEF DESCRIPTION OF THE DRAWINGS

Exemplary embodiments of the disclosure are explained in greater detail below with reference to the drawings, in which.

DETAILED DESCRIPTION

Figure 1:
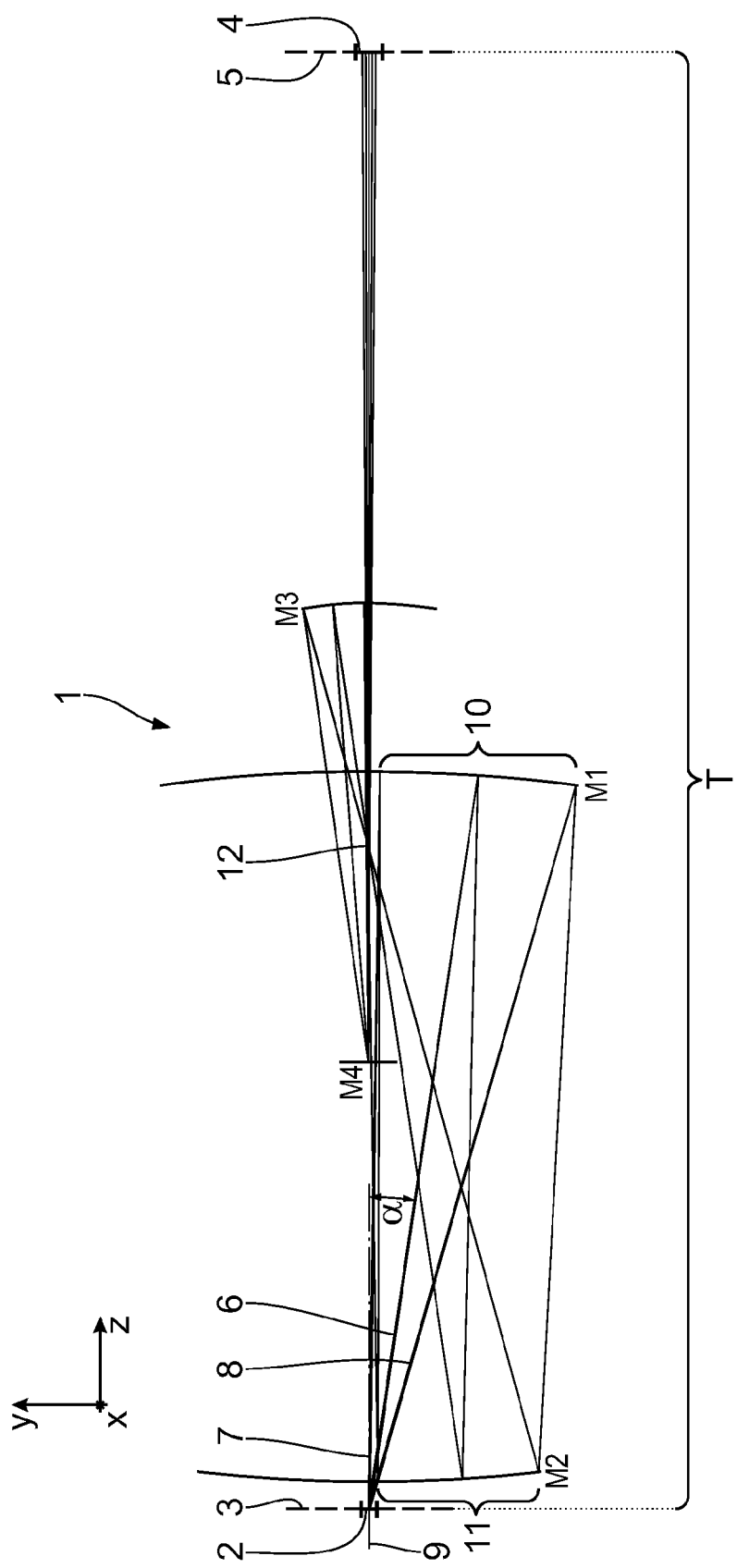
FIG. 1 shows a meridional section through a first embodiment of a magnifying imaging optical unit for use in a metrology system for simulation and for analysis of effects of properties of lithography masks on an optical imaging within a projection optical unit of a projection exposure apparatus for microlithography.

A magnifying imaging optical unit 1 illustrated in FIG. 1 is used in a metrology system for analysis of a so-called aerial image (Aerial Image Metrology System, AIMS) and serves for simulation and analysis of the effects of properties of lithography masks (which are in turn used during projection exposure for producing semiconductor components) on the optical imaging of projection optical units within the projection exposure apparatus. AIMS systems are known from DE 102 20 815 A1.

The imaging optical unit 1 images an object field 2 in an object plane 3 with a magnification factor (imaging scale β) of 2000 into an image field 4 in an image plane 5. The lithography mask to be measured, which is also referred to as a reticle, can be arranged in the object field 2. A CCD chip of a CCD camera can be arranged in the image field 4 for the analysis of the magnified image generated.

FIG. 1 illustrates the course of chief rays 6 and of coma rays 7, 8 which emerge from a plurality of object field points lying one above another in the y-direction. The chief rays 6, on the one hand, and the coma rays 7, 8 on the other hand, are also designated as imaging rays hereinafter.

In order to facilitate the representation of positional relationships, a Cartesian xyz co-ordinate system is used below. The x-axis runs perpendicularly to the plane of the drawing into the latter in FIG. 1. The y-axis runs upwards in FIG. 1. The z-axis runs towards the right in FIG. 1.

The object field 2 and the image field 4 lie in xy planes spaced apart from one another.

The chief rays 6 emerge in the imaging beam path between the object field 2 and the image field 4 from the object field 2 with a chief ray angle α of 8° with respect to a normal 9—running in the z-direction—to a central object field point of the object plane 3.

An object-field-side numerical aperture of the imaging optical unit 1 is NAO=0.125. With the aid of a decentralable aperture stop, the object-field-side numerical aperture can be reduced to NAO=0.0625 or NAO=0.0825, in which case a chief ray angle α of 6° can simultaneously be realized.

In the image plane 5, the imaging rays 6 to 8 impinge on the image field 4 almost perpendicularly to the image plane 5 and almost parallel to one another.

In the imaging beam path between the object field 2 and the image field 4, the imaging optical unit 1 has exactly four mirrors, which are designated hereinafter by M1, M2, M3 and M4 in the order in which they are arranged in the imaging beam path.

The decenterable and exchangeable aperture stop can be arranged in the structural space between the object plane 3 and the mirror M2. This is not illustrated in FIG. 1.

The fourth mirror M4 in the beam path downstream of the object field 2 is convex and spherical. The first three mirrors M1 to M3 in the beam path downstream of the object field 2 are configured concave and aspherical.

FIG. 1 illustrates the curves of intersection of parent surfaces which are used for the mathematical modeling of the reflection surfaces of the mirrors M1 to M4. Those regions of the reflection surfaces of the mirrors M1 to M4 to which the coma rays 7, 8 are applied and between the coma rays 7, 8 imaging radiation is actually applied are actually physically present in the sectional plane illustrated.

A reflection surface 10—used for imaging—of the mirror M1 (the first mirror down-stream of the object field 2) and a reflection surface 11—used for imaging—of the mirror M2 (the second mirror downstream of the object field 2) lie, in the meridional section illustrated, completely on one and the same side of a common axis of rotational symmetry of the reflection surfaces (mirrors M1 to M4) of the imaging optical unit 1. This common axis of rotational symmetry, which is also designated as optical axis oA, coincides with the normal 9 to the central object field point. The object field 2 of the imaging optical unit 1 according to FIG. 1 is centered on the optical axis oA (on-axis).

The used reflection surfaces 10, 11 of the two mirrors M1, M2 therefore both lie below the normal 9 in the meridional plane shown in FIG. 1.

An intermediate image 12 lies in the imaging beam path between the mirrors M2 and M3. The intermediate image 12 is centered on the optical axis oA (on-axis).

The imaging optical unit 1 is designed for an operating wavelength of 13.5 nm.

Optical data of the imaging optical unit 1 according to FIG. 1 are reproduced below with the aid of two tables. In the column "Radius", the first table shows the respective radius of curvature of the mirrors M1 to M4. The third column (Thickness) describes the distance, proceeding from the object plane 3, in each case to the downstream surface in the z-direction.

The second table describes the exact surface shape of the reflection surfaces of the mirrors M1 to M4, wherein the constants K and A to C should be inserted into the following equation for the sagitta:

$$z(h) = \frac{ch^2}{1 + SQRT\{1 - (1 + K)c^2h^2\}} + Ah^4 + Bh^6 + Ch^8.$$

In this case, h represents the distance from the optical axis, that is to say from the normal 9, of the imaging optical unit 1. $h^2=x^2+y^2$ therefore holds true. The reciprocal of "Radius" is inserted into the equation for c.

| Surface | Radius | Thickness | Operating mode |
|---|---|---|---|
| Object | Infinite | 2551.117 | |
| M1 | −4351.884 | −2450.207 | REFL |
| M2 | 5254.886 | 3032.313 | REFL |
| M3 | −1122.534 | −1592.004 | REFL |
| M4 | −6.565 | 3498.111 | REFL |
| Image | Infinite | 0.000 | |

| Surface | K | A | B | C |
|---|---|---|---|---|
| M1 | 0.000000E+00 | −9.911315E−13 | −2.013884E−20 | −7.941825E−27 |
| M2 | 0.000000E+00 | −5.162330E−12 | −3.451054E−19 | 0.000000E+00 |
| M3 | 0.000000E+00 | 1.528103E−11 | 0.000000E+00 | 0.000000E+00 |

The table below reproduces the angles of incidence of the chief ray 6 of the central object field point and the maximum angles of incidence of the imaging rays 6 to 8 on the individual mirrors M1 to M4:

| | Angle of incidence of the chief ray of the central field point | Maximum angle of incidence of imaging rays in meridional section |
|---|---|---|
| M1 | 3.29° | 6.1° |
| M2 | 4.62° | 8.7° |
| M3 | 1.78° | 3.3° |
| M4 | 2.13° | 4.0° |

The maximum angle of incidence of the chief ray is therefore 4.62°. The maximum angle of incidence of the imaging rays is 8.7°. For these maximum angles of incidence suffices to apply the mirrors M1 to M4 for the operating wavelength at 13.5 nm with a multilayer coating having an individual layer thickness that is constant over the used reflection surface of the mirrors M1 to M4. With comparatively simple production, this results in high reflectances of the mirrors M1 to M4 and a correspondingly high throughput of the imaging optical unit 1 for the operating wavelength of 13.5 nm.

A structural length T, that is to say a distance between the object plane 3 and the image plane 5, is 5039 mm. A ratio of the structural length T and the imaging scale β is therefore 5039 mm/2000=2.52 mm.

A field radius in the object plane 3 is 10 μm. Within a radius of 10 μm around the optical axis, therefore, the object field 2 is imaging-aberration-corrected. Correspondingly, the image field 4 is then imaging-aberration-corrected within a radius of 20 mm.

The imaging optical unit 1 is therefore part of a metrology system. This metrology system also includes a light source and an illumination optical unit for illuminating the object field 2, and the CCD chip already discussed in connection with the image field 4, the chip being part of a detection device of the metrology system.

Appropriate light sources include the light sources which are also customary for lithography systems, that is to say, for example, laser plasma sources (LPP; laser produced plasma) or else discharge sources (DPP; discharge produced plasma).

Figure 2:
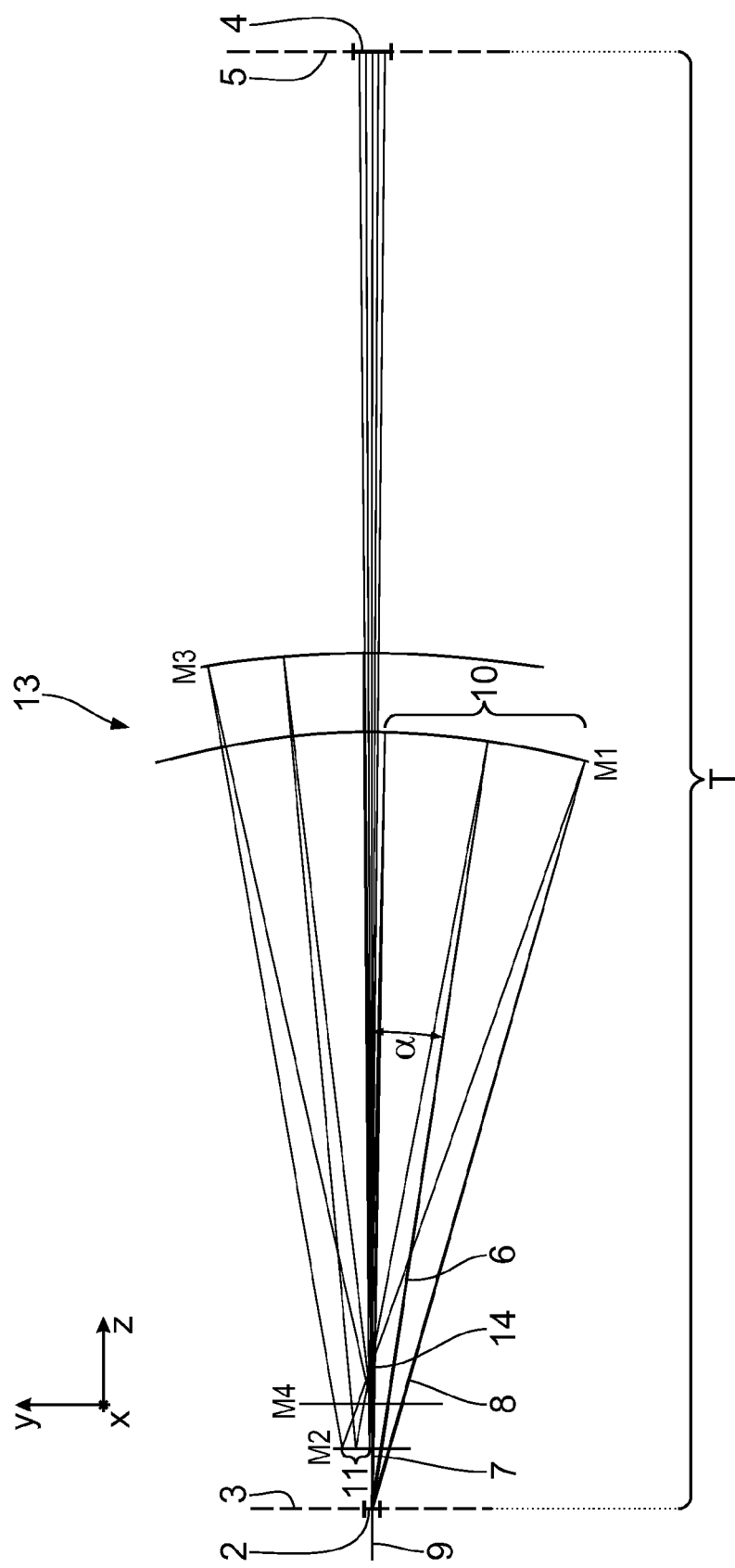
FIG. 2 shows, in an illustration similar to FIG. 1, a further embodiment of an imaging optical unit.

With reference to FIG. 2, a description as given below of a further embodiment of an imaging optical unit 13, which can be used instead of the imaging optical unit 1 according to FIG. 1. Components and functions corresponding to those which have already been explained above with reference to FIG. 1 bear the same reference numerals and will not be discussed in detail again.

In the case of the embodiment of the imaging optical unit 13 according to FIG. 2, the reflection surface 10—used for imaging—of the first mirror M1 in the imaging beam path, on the one hand, and the reflection surface 11—used for imaging—of the second mirror M2 in the imaging beam path, on the other hand, lie on opposite sides of the common axis of rotational symmetry of the reflection surfaces of the imaging optical unit 13, that is to say on opposite sides of the normal 9.

In the case of the imaging optical unit 13, an intermediate image 14 lies in the imaging beam path between the mirrors M1 and M2 spatially directly alongside the mirror M4.

The optical data of the imaging optical unit 13 according to FIG. 2 are reproduced below with two tables, which correspond in terms of structure to the tables of the imaging optical unit 1 according to FIG. 1.

| Surface | Radius | Thickness | Operating mode |
|---|---|---|---|
| Object | Infinite | 1280.334 | |
| M1 | −1143.955 | −1180.334 | REFL |
| M2 | 575.747 | 1311.691 | REFL |
| M3 | −1399.087 | −1235.626 | REFL |
| M4 | −2.812 | 2221.058 | REFL |
| Image | Infinite | 0.000 | |

| Surface | K | A | B | C |
|---|---|---|---|---|
| M1 | 0.000000E+00 | 1.009797E−11 | −2.139106E−18 | 4.620399E−24 |
| M2 | 0.000000E+00 | 4.143783E−09 | −1.165432E−13 | −1.256966E−17 |
| M3 | 0.000000E+00 | −1.446239E−11 | 2.217783E−17 | −1.798948E−23 |

The angles of incidence of the chief ray 6 of the central object field point and the maximum angles of incidence of the imaging rays 6 to 8 in meridional section on the individual mirrors M1 to M4 are summarized in the following table:

|    | Angle of incidence of the chief ray of the central field point | Maximum angle of incidence of imaging rays in meridional section |
|----|---|---|
| M1 | 0.94° | 1.7° |
| M2 | 7.37° | 13.7° |
| M3 | 0.72° | 1.4° |
| M4 | 3.16° | 5.9° |

The maximum angle of incidence of the chief ray is therefore 7.37°. The maximum angle of incidence of the imaging rays is 13.7°.

The imaging scale β of the imaging optical unit 13 is 2000 and is likewise magnifying between the object field 2 and the image field 4. The structural length T is 2 397 mm. The quotient T/β is 1.20.

Figure 3:
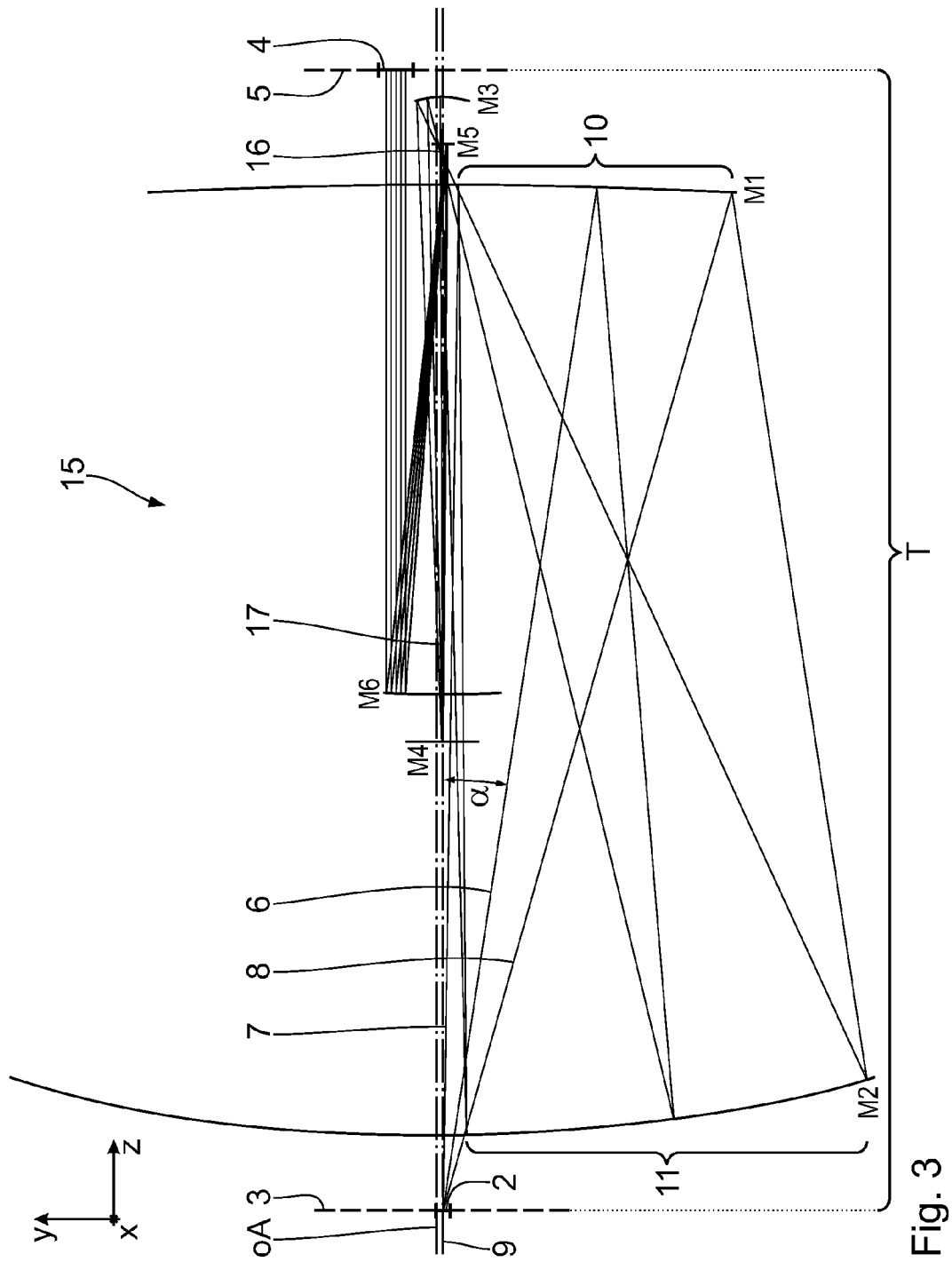
FIG. 3 shows, in an illustration similar to FIG. 1, a further embodiment of an imaging optical unit.

With reference to FIG. 3, a description is given below of a further embodiment of an imaging optical unit 15, which can be used instead of the imaging optical unit 1 according to FIG. 1. Components and functions corresponding to those which have already been explained above with reference to FIG. 1 bear the same reference numerals and will not be discussed in detail again.

The imaging optical unit 15 has a total of six mirrors, which are numbered consecutively by M1 to M6 in the order in which they are arranged in the imaging beam path between the object field 2 and the image field 4.

The first three mirrors of the imaging optical unit 15, that is to say the mirrors M1 to M3, are embodied aspherically. The last three mirrors, that is to say the mirrors M4 to M6, are embodied spherically.

In the case of the imaging optical unit 15, the object field 2 and the image field 4 lie outside the optical axis oA, which in this case does not coincide with the normal 9, but rather runs parallel to the normal 9.

In FIG. 3, the object field 2 lies very slightly, namely approximately 100 μm, below the optical axis oA.

The imaging optical unit 15 has a magnifying imaging scale β of 2000. The structural length T of the imaging optical unit 15 is 1 217 mm, the quotient T/β0 is 0.61.

A first intermediate image 16 of the imaging optical unit 15 lies in the beam path between the mirrors M2 and M3. A second intermediate image 17 lies in the beam path between the mirrors M4 and M5. Both intermediate images 16, 17 lie adjacent to the optical axis oA.

The optical data of the imaging optical unit 15 according to FIG. 3 are reproduced below with the aid of two tables, which correspond in terms of structure to the tables of the imaging optical unit 1 according to FIG. 1.

| Surface | Radius | Thickness | Operating mode |
|---|---|---|---|
| Object | Infinite | 1094.383 | |
| M1 | −5069.796 | −1014.383 | REFL |
| M2 | 1541.181 | 1106.997 | REFL |
| M3 | −115.243 | −686.984 | REFL |
| M4 | −48.094 | 636.986 | REFL |
| M5 | −96.403 | −586.987 | REFL |
| M6 | 1069.542 | 666.985 | REFL |
| Image | Infinite | 0.000 | |

| Surface | K | A | B | C |
|---|---|---|---|---|
| M1 | 0.000000E+00 | −2.256066E−11 | 2.265548E−17 | −7.943975E−24 |
| M2 | 0.000000E+00 | −1.427091E−11 | −6.408816E−18 | −1.613985E−24 |
| M3 | 0.000000E+00 | 5.287695E−08 | −1.254664E−13 | −2.306538E−16 |

The angles of incidence of the chief ray 6 of the central object field point and the maximum angles of incidence of the imaging rays 6 to 8 in meridional section on the individual mirrors M1 to M6 are summarized in the following table:

|    | Angle of incidence of the chief ray of the central field point | Maximum angle of incidence of imaging rays in meridional section |
|----|---|---|
| M1 | 6.25° | 11.6° |
| M2 | 4.11° | 7.6° |
| M3 | 5.79° | 10.6° |
| M4 | 0.79° | 1.4° |
| M5 | 2.25° | 2.8° |
| M6 | 2.46° | 3.0° |

The maximum angle of incidence of the chief ray is therefore 6.25°. The maximum angle of incidence of the imaging rays is 11.6°.

A maximum angle of incidence of the chief rays 6 on the image plane 5 is 0.2 mrad in the case of the imaging optical unit 15. The imaging optical unit 15 is telecentric on the image side.

Figure 4:
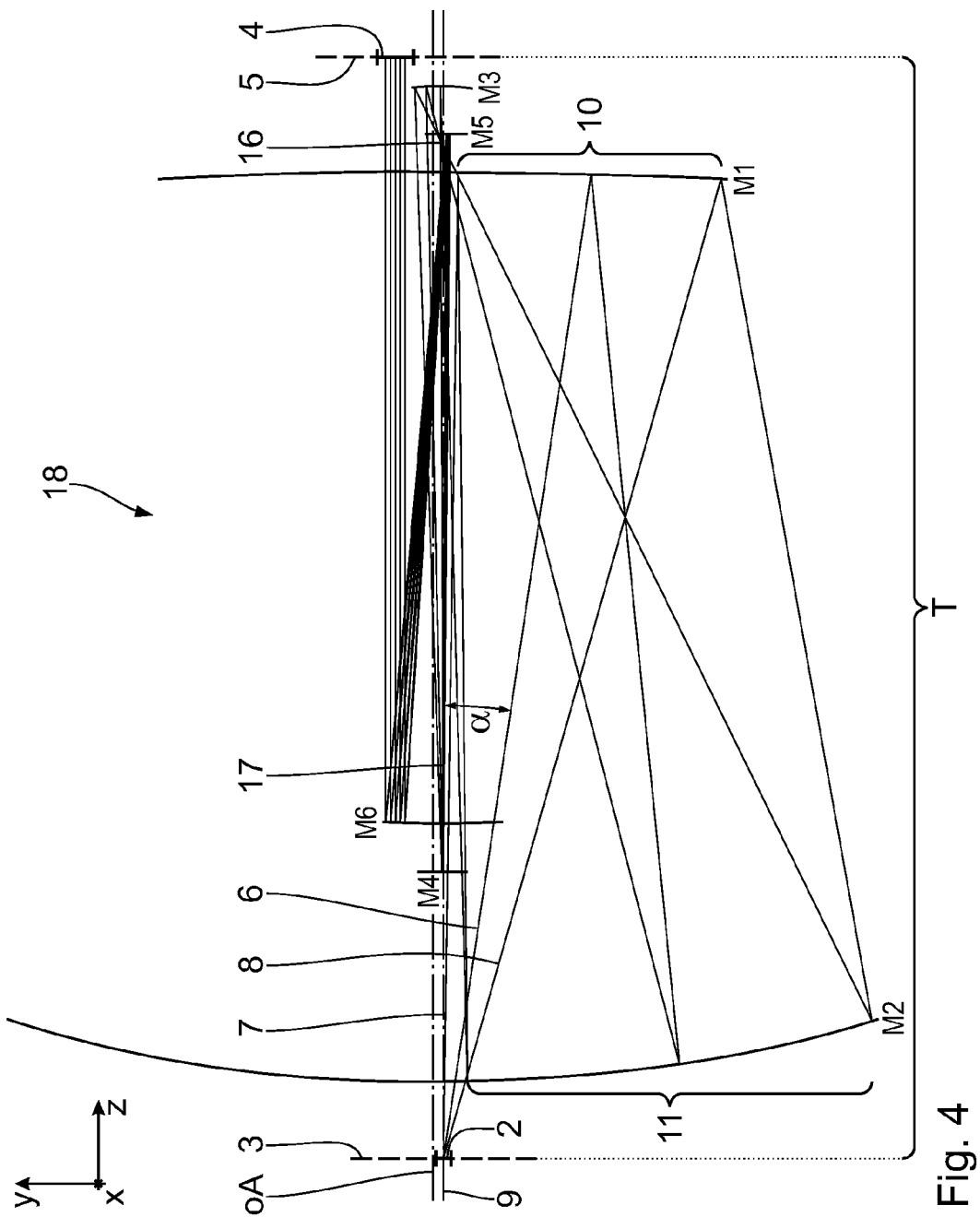
FIG. 4 shows, in an illustration similar to FIG. 1, a further embodiment of an imaging optical unit.

With reference to FIG. 4, a description is given below of a further embodiment of an imaging optical unit 18, which can be used instead of the imaging optical unit 1 according to FIG. 1. Components and functions corresponding to those which have already been explained above with reference to FIG. 1 bear the same reference numerals and will not be discussed in detail again.

The imaging optical unit 18 according to FIG. 4 also has a magnifying imaging scale β of 2000. The structural length T is 1 150 mm. The ratio T/β is 0.575 in the case of the imaging optical unit 18. The spherical mirror M4 has the smallest radius of curvature. The radius of curvature is 56 mm.

The optical data of the imaging optical unit 18 according to FIG. 4 are reproduced below with the aid of two tables, which correspond in terms of structure to the tables of the imaging optical unit 1 according to FIG. 1.

| Surface | Radius | Thickness | Operating mode |
|---|---|---|---|
| Object | Infinite | 1029.610 | |
| M1 | −6339.907 | −949.610 | REFL |
| M2 | 1440.086 | 1040.263 | REFL |

-continued

| Surface | Radius | Thickness | Operating mode |
|---|---|---|---|
| M3 | −119.092 | −820.245 | REFL |
| M4 | −56.197 | 770.245 | REFL |
| M5 | −130.703 | −720.245 | REFL |
| M6 | 1297.051 | 800.245 | REFL |
| Image | Infinite | 0.000 | |

| Surface | K | A | B | C |
|---|---|---|---|---|
| M1 | 0.000000E+00 | −6.408521E−11 | 7.162652E−17 | −4.276723E−23 |
| M2 | 0.000000E+00 | −1.933145E−11 | −1.212738E−17 | −4.374040E−24 |
| M3 | 0.000000E+00 | 7.511917E−08 | −2.421135E−13 | −1.932664E−16 |

The angles of incidence of the chief ray 6 of the central object field point and the maximum angles of incidence of the imaging rays 6 to 8 in meridional section on the individual mirrors M1 to M6 are summarized in the following table:

| | Angle of incidence of the chief ray of the central field point | Maximum angle of incidence of imaging rays in meridional section |
|---|---|---|
| M1 | 6.65° | 12.2° |
| M2 | 4.13° | 7.7° |
| M3 | 6.26° | 11.4° |
| M4 | 0.72° | 1.3° |
| M5 | 1.83° | 2.3° |
| M6 | 2.03° | 2.5° |

The maximum angle of incidence of the chief ray is therefore 6.65°. The maximum angle of incidence of the imaging rays is 12.2°.

The structural length T always relates to an unfolded configuration of the imaging optical unit, that is to say to a configuration without interposed plane mirrors having a purely deflecting effect. The structural length T is defined either by the distance between the object field and the image field, by the distance between the object field and the optical component most distant therefrom, or by the distance between the image field and the optical component most distant therefrom.

What is claimed is:

1. An imaging optical unit having an object field in an object plane and an image field in an image plane, the imaging optical unit comprising:
    at least four mirrors configured to image the object field along a beam path into the image field,
    wherein a ratio of a structural length of the imaging optical unit to an imaging scale of the imagining optical unit is less than 4.9 mm, and the imaging optical unit has an intermediate image plane between the object field and the image field.

2. The imaging optical unit of claim 1, wherein the imaging scale of the imaging optical unit that is greater than 500.

3. The imaging optical unit of claim 1, wherein the imaging optical unit has an object-side numerical aperture of at least 0.0625.

4. The imaging optical unit of claim 1, wherein the imaging optical unit has an object-side chief ray angle of at least 6°.

5. The imaging optical unit of claim 1, wherein the imaging optical unit has an image-side chief ray angle of at most 0.5°.

6. The imaging optical unit of claim 1, wherein a maximum angle of incidence of a chief ray of a central field point on one of the at least four mirrors is 7.37°.

7. The imaging optical unit of claim 1, wherein a maximum angle of incidence of an imaging ray on one of the at least four mirrors in meridional section is 13.7°.

8. The imaging optical unit of claim 1, wherein the imaging optical unit includes exactly four mirrors.

9. The imaging optical unit of claim 8, wherein a fourth mirror in the beam path downstream of the object field is convex.

10. The imaging optical unit of claim 8, wherein a fourth mirror in the beam path downstream of the object field is spherical.

11. The imaging optical unit of claim 8, wherein a first mirror to a third mirror in the beam path downstream of the object field are concave.

12. The imaging optical unit of claim 8, wherein a first mirror to a third mirror in the beam path downstream of the object field are aspherical.

13. The imaging optical unit of claim 8, wherein both a reflection surface used for imaging of a first mirror downstream of the object field and a reflection surface used for imaging of a second mirror downstream of the object field lie completely on the same side of a common axis of rotational symmetry of reflection surfaces of the imaging optical unit.

14. The imaging optical unit of claim 8, wherein a reflection surface used for imaging of a first mirror downstream of the object field and a reflection surface used for imaging of a second mirror downstream of the object field lie completely on opposite sides of a common axis of rotational symmetry of reflection surfaces of the imaging optical unit.

15. The imaging optical unit of claim 1, wherein the imaging optical unit has an additional intermediate image plane between the object field and the image field.

16. The imaging optical unit of claim 1, wherein the intermediate image plane is formed between a first mirror in the beam path downstream of the object plane and a second mirror in the beam path downstream of the object field.

17. The imaging optical unit of claim 1, wherein the imaging optical unit includes exactly six mirrors.

18. The imaging optical unit of claim 17, wherein a fourth mirror to a sixth mirror in the beam path downstream of the object field are spherical.

19. The imaging optical unit of claim 17, wherein the imaging optical unit has two intermediate image planes between the object field and the image field.

20. The imaging optical unit of claim 19, wherein one of the intermediate image planes is between a second mirror in the beam path downstream of the object field and a third mirror in the beam path downstream of the object field.

21. The imaging optical unit of claim 19, wherein one of the intermediate image planes is between a fourth mirror in the beam path downstream of the object field and a fifth mirror in the beam path downstream of the object field.

22. The imaging optical unit of claim 1, wherein a smallest radius of curvature of the at least four mirrors is greater than 50 mm.

23. The imaging optical unit of claim 22, wherein the smallest radius of curvature of the mirrors is on a spherical mirror.

24. The imaging optical unit of claim 1, wherein the imaging optical unit is telecentric on the image side.

25. The imaging optical of claim 1, wherein the object field and/or the image field are/is arranged overall at a distance from a common axis of rotational symmetry of reflection surfaces of the imaging optical unit.

26. A system, comprising:
   an imaging optical unit having an object field in an object plane and an image field in an image plane, the imaging optical unit comprising at least four mirrors configured to image the object field along a beam path into the image field, a ratio of a structural length of the imaging optical unit to an imaging scale of the imagining optical unit being less than 4.9 mm, and the imaging optical unit having an intermediate image plane between the object field and the image field; and
   a spatially resolving detection device configured to detect the imaging field.

* * * * *

UNITED STATES PATENT AND TRADEMARK OFFICE
CERTIFICATE OF CORRECTION

PATENT NO. : 8,827,467 B2  
APPLICATION NO. : 13/358026  
DATED : September 9, 2014  
INVENTOR(S) : Hans-Juergen Mann Page 1 of 1

It is certified that error appears in the above-identified patent and that said Letters Patent is hereby corrected as shown below:

In the Specification

In Col. 4, line 7, delete "decentralable" and insert -- decenterable --.

In Col. 7, line 57, delete "T/β0" and insert -- T/β --.

In the Claims

In Col. 11, line 6, Claim 25, delete "optical" and insert -- optical unit --.

Signed and Sealed this  
Sixteenth Day of December, 2014

Michelle K. Lee  
*Deputy Director of the United States Patent and Trademark Office*